(12) United States Patent
Haji-Aghajani et al.

(10) Patent No.: US 7,464,360 B2
(45) Date of Patent: Dec. 9, 2008

(54) COMMON INTERFACE FRAMEWORK FOR DEVELOPING FIELD PROGRAMMABLE DEVICE BASED APPLICATIONS INDEPENDENT OF A TARGET CIRCUIT BOARD

(75) Inventors: Kazem Haji-Aghajani, Amherst, NH (US); Christopher L Hayes, Londonderry, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 421 days.

(21) Appl. No.: 11/385,192

(22) Filed: Mar. 21, 2006

(65) Prior Publication Data

US 2006/0190904 A1 Aug. 24, 2006

Related U.S. Application Data

(63) Continuation-in-part of application No. 10/303,441, filed on Nov. 25, 2002, now Pat. No. 7,017,140.

(60) Provisional application No. 60/407,880, filed on Aug. 29, 2002.

(51) Int. Cl.
*G06F 17/50* (2006.01)
(52) U.S. Cl. ............... 716/17; 716/1; 716/12; 716/18
(58) Field of Classification Search ............ 716/1, 716/12, 17, 18
See application file for complete search history.

(56) References Cited

U.S. PATENT DOCUMENTS 5,590,156 A 12/1996 Carney
5,828,858 A 10/1998 Athanas et al.
5,907,697 A 5/1999 Barbier et al.
6,047,115 A 4/2000 Mohan et al.

(Continued)

FOREIGN PATENT DOCUMENTS

EP 1 187 042 A1 3/2002

(Continued)

OTHER PUBLICATIONS

PCT International Search Report dated Feb. 17, 2004 of International Application No. PCT/US03/27097 filed Aug. 28, 2003.

(Continued)

*Primary Examiner*—Thuan Do
(74) *Attorney, Agent, or Firm*—Vern Maine & Associates

(57) ABSTRACT

A multi-level framework that allows an application to be developed independent of the chip or board, and any dependency is built in as part of the framework of the field programmable device (FPD). According to one embodiment, a field programmable device (FPD) comprises at least one hardware design language (HDL) application core with at least one component virtual interface respectively coupled to the HDL core, wherein the HDL core and the component virtual interface form a component, and wherein the component virtual interface has a plurality of pre-defined interfaces for communicating with the core. The component is hardware independent of the FPD. There is a target platform interface coupled to the component virtual interface wherein the target platform interface incorporates hardware specific information. A framework manager is coupled to the target platform interface and communicates with at least one operating system.

15 Claims, 8 Drawing Sheets

U.S. PATENT DOCUMENTS

| | | | |
|---|---|---|---|
| 6,058,263 A * | 5/2000 | Voth | 703/25 |
| 6,128,276 A | 10/2000 | Agee | |
| 6,182,258 B1 | 1/2001 | Hollander | |
| 6,204,687 B1 | 3/2001 | Schultz et al. | |
| 6,215,898 B1 | 4/2001 | Woodfill et al. | |
| 6,216,191 B1 | 4/2001 | Britton et al. | |
| 6,230,307 B1 | 5/2001 | Davis et al. | |
| 6,308,311 B1 | 10/2001 | Carmichael et al. | |
| 6,311,321 B1 | 10/2001 | Agnihotri et al. | |
| 6,351,778 B1 | 2/2002 | Orton et al. | |
| 6,353,915 B1 | 3/2002 | Deal et al. | |
| 6,691,301 B2 | 2/2004 | Bowen | |

FOREIGN PATENT DOCUMENTS

| | | |
|---|---|---|
| WO | 01/45258 A2 | 6/2001 |
| WO | 02/05444 A2 | 1/2002 |
| WO | 02/056481 A2 | 7/2002 |

OTHER PUBLICATIONS

Armstrong, Rob et al., "Toward A Common Component Architecture For High-Performance Scientific Computing", Proceedings Of The 1999 Conference On Distributed Computing, 1999, pp. 1-17, [Online] [retrieved on Nov. 19, 2002] Retrieved from the internet <URL: http://www-unix.mcs.anl.gov/%7Ecurfman/cca/web/cca_paper.html>.

"The Pipelined Frequency Transform", RF Engines Ltd. White Paper, Feb. 20, 2002, pp. 1-14, ref No. PFT001.Rev2.

Myers, Corey et al., "Rapid Development of Signal Processors and the RASSP Program", Apr. 20, 1994, pp. 1-8, Lockheed Sanders, Inc.

Gardner, W.B. et al., "An Object-Oriented Layered Approach to Interfaces for Hardware/Software Codesign of Embedded Systems", Proceedings of the 31st Hawaii International Conference On System Sciences, Jan. 1998, pp. 197-206, vol. VII, IEEE, Kona, Hawaii.

Spivey, Gary et al., "A Component Architecture for FPGA-Based, DSP System Design", Proceedings of the International Conference on Application Specific Systems, Architectures, and Processors, Jul. 2002, pp. 1-11, San José, California.

Saul, J.M., "Hardware/Software Codesign for FPGA-Based Systems", Proceedings Of The 32nd Hawaii International Conference On System Sciences, 1999, pp. 1-10, IEEE.

"From Algorithm to Hardware—The Great Tools Disconnect", COTS Journal, Oct. 2001, pp. 48-63.

Lim, Davin et al., "Two Flows for Partial Reconfiguration: Module Based or Small Bit Manipulations", May 17, 2002, pp. 1-23, XAPP290 (v1.0), Pub. Xilinx Inc.

"Common Component Architecture Forum", CCA Forum, 2002, pp. 1-41, [Online] [retrieved on Nov. 7, 2002] Retrieved from the internet <URL: www.cca-forum.org>.

Spivey et al: "A Component Architecture for FPGA-Based, DSP System Design", Application-Specific Systems, Architectures and Processors, 2002. Proceedings. The IEEE International Conference on Jul. 17-19, 2002, Piscataway, NJ, USA, IEEE, Jul. 17, 2002, pp. 41-51, XP010601458, ISBN: 0-7695-1712-9.

Chou et al: "Ipchinook: An Integrated IP-Based Design Framework for Distributed Embedded Systems", Proceedings of the 1999 Design Automated Conference. 36th DAC, New Orleans, LA, Jun. 21-25, 1999, Proceedings of the Design Automation Conference, New York, NY: IEEE, US, Jun. 21, 1999, pp. 44-49, XP000887843, ISBN: 0-7803-5560-01.

Bellows et al: "JHDL—An HDL for Reconfigurable Systems", FPGAS For Custom Computing Machines, 1998, Proceedings. IEEE Symposium on Napa Valley, CA, USA, Apr. 15-17, 1998, Los Alamitos, CA, USA, IEEE Comput. Soc, US, Apr. 15, 1998, pp. 175-184, XP010298180, ISBN: 0-8186-8900-5.

Fleischmann et al: "Java Driven Codesign and Prototyping of Networked Embedded Systems", Design Automation, 1999. 36th annual Conference on New Orleans, LA, USA, Jun. 21-25, 1999, Piscataway, NJ, USA, IEEE Jun. 21, 1999, pp. 794-797, XP010762128, ISBN 1-58113-109-7.

Haji, K. et al. "A Reconfigurable Computing Platform for Detection and Direction Finding of Frequency Hopping Signals", pp. 1-7, Sep. 24, 1998, Southwest Research Institute.

* cited by examiner

COMMON INTERFACE FRAMEWORK FOR DEVELOPING FIELD PROGRAMMABLE DEVICE BASED APPLICATIONS INDEPENDENT OF A TARGET CIRCUIT BOARD

RELATED APPLICATIONS

This application is a Continuation-in-Part of U.S. patent application Ser. No. 10/303,441, filed Nov. 25, 2002 which claims the benefit of U.S. Provisional Applications No. 60/407,880, filed Aug. 29, 2002.

FIELD OF THE INVENTION

The present invention relates to reusable software, and more particularly to multi-level framework that allows a core application to be developed independent of the chip or board and dependency is built in as part of the framework.

BACKGROUND OF THE INVENTION

The rapid evolution of technology has posed significant problems, as well as benefits. Some technologies never achieve their full potential while others evolve rapidly, leaving earlier versions obsolete shortly after they have been installed. Technologies typically need to be substituted or otherwise adapted to compensate for different needs, requiring wholesale redesigns even when the redesign employed similar building blocks. It is well-known that software can be used to allow integration of new hardware or allowing existing hardware to fulfill new functions without starting from scratch. In theory, similar hardware elements can be used and modified by the underlying software to accommodate changes.

Large-scale software development has evolved rapidly from its inception. Through the 1980s large-scale software was developed in modular systems of subsystems, and even today these are the most common systems in use. These systems are largely hardware dependent, and problems or errors can be detected down to the level of the subsystem. These systems were based on point solutions where the problem/solution is functionally decomposed into subsystems. Unfortunately, potential reuse of the software for other applications must have been anticipated during development and integrated into the software design. Extensions of the software are difficult and can only be achieved when such extensions were anticipated and designed into the system architecture itself.

In the 1990s, some improvement came with the advent of Object Oriented Systems (OOS). OOS are still hardware dependent topologies, as they are designed for specific hardware configurations and modules are not produced. These systems were based, like their predecessors, on point solutions and are deficient in a number of respects. The point solutions for OOS are derived using Object Oriented Analysis. Extension of the system using existing components was difficult as a result of the multiplicity of languages used.

A known interoperable architecture is Software Communication Architecture (SCA). This architecture is used in such applications as Software Defined Radio (SDR). SCA has specific Interface Definition Language (IDL) interfaces defined for software radios. Any new desired capabilities must fit in to pre defined IDL. SCA provides an interface framework, however as such, it is not hardware independent. While upper layer interfaces are well defined in SCA, lower layer interfaces are largely ignored. SCA is also typically reliant on Common Object Request Broker Architecture (CORBA) layered communications and there are some problems related to CPU overhead and quality of service. Messages can be delivered out of order and processed by different threads when belonging to the same data streams.

In recent years there has been much attention centered on layered or component-based systems. In theory, such a system has a thin common layer or component base class that is used in the development of all software modules. Each of the major capabilities of the system is represented by at least one module or component. These modules or components are thus "wrapped" in the thin common layer. Independent components are developed, tested, and packaged independently of each other, and while operating have no knowledge of their environment, since all input/output is constrained to interface ports connected from the outside. Run time discoverable parameter ports control specific behavior. Software components would allow reuse by performing a particular function and providing an appropriate interface with a larger system. Each component would ideally be autonomous regarding its particular functionality. This autonomy would allow changes to be made with individual components without disturbing the configuration of the entire system. Relating the various quasi-autonomous components to each other results in a high degree of complexity in communication and synchronization code.

A system of reusable and flexible components is especially useful for military contractors. In the past, software was designed specifically for a single contract. When a new contract was bid, the contractor started from scratch. As discussed herein, differences in language and architecture prevented different functionalities from being reused from earlier contracts. Since the software was newly developed there remained a relatively high risk of failure in the software or its interfaces, therefore the new software required testing and debugging, adding to the cost of the contract. The application of a flexible framework of reusable and interchangeable components would enable a designer to leverage earlier development investments and minimize risk of failure in the development process. Contractors would be able to provide clients with more accurate and lower bids and possibly prototypes or catalogues of products easily configured to the clients needs.

The use of object oriented, distributed framework based software systems has led to improvement in the modularization of software, but has increased the complexity of the hardware. The heterogeneity of the distributed computing platform means that the interfaces with devices such as field programmable gate arrays (FPGA) and similar devices became increasingly complex. Interfaces between processors eat into valuable computing time and retard calculations. In applications that require real time processing, the general purpose processors are not satisfactory. In addition, the power requirements generally become excessive.

In order to achieve real time processing, field programmable gate arrays (FPGAs) are employed. The applications coded in hardware design language (HDL) running on FPGAs achieve orders of magnitude speed improvements over their software counterparts running on general purpose computers. The reconfigurability of the FPGAs provides adaptive processing, and high density FPGAs currently accommodate multiple complex applications running in parallel. But, there are significant problems in integrating with multiple applications, which run on FPGAs and boards manufactured by the various manufacturers into a coherent form.

Distributed processing systems of general purpose or special purpose computers, use a framework of common electrical, physical, and logical interfaces to specify and enforce compatible interfaces between software programs that perform discretely defined processing (components). In a distributed processing system of general purpose or special purpose computers, signal and specialized data processing can consume more processing time and resources than can be provided in a processor. To obtain more processing per volume or per cost, the known devices use specialized digital hardware such as FPGA's, or special purpose integrated circuits. These mechanisms do not provide a common, controllable interface that can interface in a common way to other software-based signal and data processing components in the distributed system. Customarily, large computations of partitionable problems with time constraints are performed using distributed processing.

There is a significant desire for faster and denser FPGA's, particularly in fields such as signal intelligence (SIGINT) that perform front end processing of data from various sensors. The faster the computational algorithms and digital signal processing functions are processed the faster the system can respond. Unfortunately, the core functions are designed and implemented for each specific task without any consideration of code reuse or interoperability between cores or both which results in expensive modification costs when a different FPGA is targeted.

These specialized interfaces may have commonality in terms of physical and electrical interface, but have not been common in terms of logical interface, nor have had the complexity required of modern software based interfaces. These existing mechanisms do not provide a common, controllable interface that can interface in a common way to other software-based signal and data processing components in the distributed system.

The evident reduction in engineering effort and minimization of difficulties associated with the specification, harmonization and enforcement of compatible interface between software programs executing in a network of general-purpose computers suggested the possibility that a similar approach might be taken with computing nodes containing FPGAs, gate arrays, and or special purpose integrated circuits.

A description of the difficulties in the existing implementation of FPGA boards is described in "From Algorithm to Hardware—The Great Tools Disconnect", from the COTS Journal, October 2001, pages 48-54. A further discussion of alternative designs tried under DARPA is discussed in "VSIPL: Developing Portable Applications for COTS" COTS Journal, October 2001, pages 57-63. In addition, there is a Common Component Architecture (CCA) Forum established by researchers from national labs and academia that are seeking to establish standard component architecture for high performance computing. The CCA Forum internet site at http://www.cca-forum.org and there are numerous papers, articles and presentation material of general interest.

There are certain board vendors that provide circuit boards with FPGAs, such as those by Annapolis Microsystems, but the implementation has an internal interface scheme that does not provide for a standard interface for other commercial off the shelf (COTS) items.

In summary, while such an approach for interoperability and code reuse is desirable, the implementation has not been successful. Prior efforts have not been successful to structure a framework that allows the apparent benefits of such a system. The integration of hardware design language (HDL) core functions to run on commercial off the shelf (COTS) platforms involving multiple vendors has several pitfalls. For example, the core functions are not written in the same HDL language and may have been coded in VHDL, AHDL or Verilog. The core functions are generally uniquely written for a given FPGA family which makes them chip dependent. The core functions are also generally written for a given COTS or proprietary board, making them board dependent. Finally, the core functions typically do not have a well-defined interface to facilitate concatenating cores together to design more complex functions.

Clearly what is needed is an interface layer to a core application in order to have reusable HDL cores that are independent of the hardware. There should be some manner in which the cores from various vendors can be mated with a system to allow a 'plug and play' environment and thereby reduce cost and time to market.

BRIEF SUMMARY OF THE INVENTION

Accordingly one embodiment of the present invention is to provide a compatible mechanism for integrating programmable devices in software based frameworks for distributed computers.

One embodiment of the invention is a system for a field programmable device (FPD), comprising at least one hardware design language (HDL) application core with at least one component virtual interface respectively coupled to the HDL core, wherein the HDL core and the component virtual interface form a component, and wherein the component virtual interface has a plurality of pre-defined interfaces for communicating with the core. The component is hardware independent of the FPD. There is a target platform interface coupled to the component virtual interface wherein the target platform interface incorporates hardware specific information. A framework manager is coupled to the target platform interface and communicates with at least one operating system.

Further aspects of the system include at least one of the following features recited herein. The system with a board comprised of at least one FPD. The system wherein the FPD comprises at least one component coupled to the target platform interface. The system further comprising at least one general purpose processor on FPD. The system with the component comprising a plurality of virtual resources. The system wherein the target platform interface has a crossbar switch communicatively coupling resources to the component. The system wherein memory requirements are satisfied by at least one of the group consisting of local memory and external memory. The system wherein the FPD comprises an enhanced inter-component communications bus. The system wherein the enhanced inter-component communications bus provides point-point, broadcast and multi-cast connections.

Another embodiment of the invention is a framework for core applications of a field programmable device (FPD) to be developed independent of hardware elements, comprising at least one component, wherein each component is comprised of a core application and a respective component virtual interface, wherein the core and the component virtual interface are hardware independent. There is a target platform interface interacting with the component, wherein the target platform interface is hardware specific and binds the component to the FPD and a board. A framework manager is coupled to the target platform interface providing an interface to at least one operating system.

The framework has a number of variations, some of which are recited herein. The framework includes wherein the component has a set of modules selected from at least one of the group consisting of a standard interface module, an enhanced inter-component communications module, and at least one virtual resource. The framework wherein the target platform interface has a set of modules selected from at least one of the group consisting of an arbiter, a crossbar switch, a memory management module, a local bus interface, a board specific external interface module, an on-chip processor bridge module, and a clock management module. The framework further comprising a processing unit embedded on the FPD and coupled to the target platform interface. It should be noted that the processing unit is broadly defined to include any form of general purpose processor as well as digital signal processor (DSP). The framework further comprising a data fabric coupled to the target platform interface. The framework further comprises a shared memory management module providing access to at least one of the group consisting of external memory and embedded memory. The embedded memory include block random access memory (RAM) and select RAM.

A further embodiment of the present invention is a method for developing programmable devices in a framework for distributed computing, comprising wrapping a component virtual interface around a core application thereby creating a component, wherein the component virtual interface has a defined interface and is hardware independent, wrapping a target platform interface around at least one component, wherein the target platform interface has a pre-defined interface and binds the component to the board; and providing a bridge between the target platform interface and at least one operating system.

There are a number of further embodiments associated with the method, including the following. The method further comprising providing memory access, including read/write. The method further comprising arbitration. The method further comprises managing power of at least one of the group consisting of the component virtual interface and the target platform interface. The method further comprising monitoring a performance of at least one of the group consisting of the component virtual interface and the target platform interface.

Another embodiment is a mechanism for creating a HDL application component independent of the target hardware. The use of HDL should be understood as including communications to the Field Programmable Device (FPD), which can also be done directly from object oriented software. Such direct FPD communication is within the scope of the present invention.

The present invention in another embodiment relates to a set of reusable, re-configurable software components that are hardware independent. The implementation of the invention decreases time to market, increases likelihood of task success, and incorporates a configuration management and verification scheme to enable reuse.

According to a further embodiment, the architecture is configured with a common set of functions and a well defined interface that makes integrations and adaptability an easier task. There are a number of components that are deployed within the framework according to a pre-defined plan. In one embodiment the functions are created on reconfigurable logic FPGAs. It should be readily apparent that the present invention is not limited to FPGA devices and any Field-programmable devices (FPDs) are within the scope of the invention, including Simple PLDs (SPLDs) and Complex PLDs (CPLDs).

Software designers generally use visual models, such as data flow/control flow diagrams or object collaboration diagrams to express system behavior in a form that is more easily understood by users and programmers, and used to generate software architecture. Data flow/control flow diagrams used in the context of a specific software modeling method, Common Object Request Broker Architecture (CORBA) are also commonly implemented.

Architecture of the present invention may use a core function, wherein the core function is independent of the architecture. The core function can be any computing function such as algorithms, mathematical functions, signal or image processing functions and so forth. The framework described herein allows components to communicate across platforms and hardware. The functionality is wrapped by a common template wherein the template is pre-defined and interfaces to the function. The template wraps around the core function and as long as the rules governing the template are abided, such as I/O ports and protocols, the core becomes a plug and play element integrated into framework.

As detailed in a one embodiment, the outer shell or component virtual interface (CVI) wraps around the core and provides the resources that any given function requires in order to facilitate the data transformation and processing. There are various engines or modules such as memory and communications engines in CVI that allows the cores to function efficiently, wherein the engines can be modules.

The wrapper drops around the core and creates the hardware-independent component. The component can be anything including a black box that manipulates input data and generates output data to another component or I/O port. The present invention also provides a framework to have identical black boxes, regardless of the internal functions, and connect them together to form a system without being bound by the target technology.

Under the framework of the present invention the CVI and core application create the component. A comprehensive system is created from the components and allows for an efficient and flexible use and reuse of core applications allowing redundancy, interoperability and code reuse. Components may communicate with each other which in one embodiment is via a cross bar.

The system can be designed in order to accomplish some function such as receive signals, process the signals and output the processed signals. For example, for a software radio application, the modulated radio signals have to be received, captured and digitized. The modulation scheme is interrogated in order to demodulate the signals. The decoded signal information signal is then output in the appropriate data form to a speaker. The algorithms that perform the demodulation, filtering and processing can form the core functions that manipulate the data, and be wrapped by the CVI to create components. As part of the processing, the data may be stored and communicated between certain components.

The combination of functions for a certain requirement can be uploaded to a given FPD on a board. When a crossbar is deployed, because the crossbar switching is under software control, it allows various arrangements of the components to accomplish the desired processing. The Target Platform Interface (TPI) crossbar allows for a seamless connection between the various components, and because the components have the same protocol/interface, the crossbar allows any arrangement of the system via the components.

A basic rationale for the present invention is that a state of the art system includes various sensors, general purpose computers, reconfigurable computers (RCC) and other devices that communicate to each other and to a network of elements. General purpose processors (GPP) can be used in applications that are not computationally intensive and for which time is not a critical factor. However, for more demanding requirements, FPD's are faster processors and can be easily modified into different configurations. The most practical and efficient design implementations for product development use Commercial off the shelf (COTS) products, wherein various vendors and manufacturers provide different FPD boards and each has somewhat specific implementations for usage. However in the known designs, the HDL code is usually designed for a given FPGA chip and a given FPGA board. Thus a different FPGA chip or board usually meant a modification of the HDL core.

Still other embodiments and advantages of the present invention will become readily apparent to those skilled in this art from the following detailed description, wherein we have shown and described only an embodiment of the invention, simply by way of illustration of one mode contemplated for carrying out the invention. As will be realized, the invention is capable of other and different embodiments, and its several details are capable of modifications in various obvious respects, all without departing from the invention.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION

One embodiment of the present invention is a mechanism for making a component independent of the hardware. Thus, one implementation of the present invention is to develop a framework where the application is developed independent of the chip or board, and any dependency is built in as part of the framework. The description herein describes one form of Field Programmable Devices (FPDs), namely Field Programmable Gate Arrays (FPGAs) in order to describe one embodiment of the invention. However, the description is equally applicable to other FPDs such as Simple Programmable Logic Devices (SPLDs), and Complex Programmable Logic Devices (CPLDs). Likewise, the use of VHDL as a core application is merely used for illustrative purposes as an example of a hardware design language (HDL) and other design languages are within the scope of the invention.

Figure 1A:
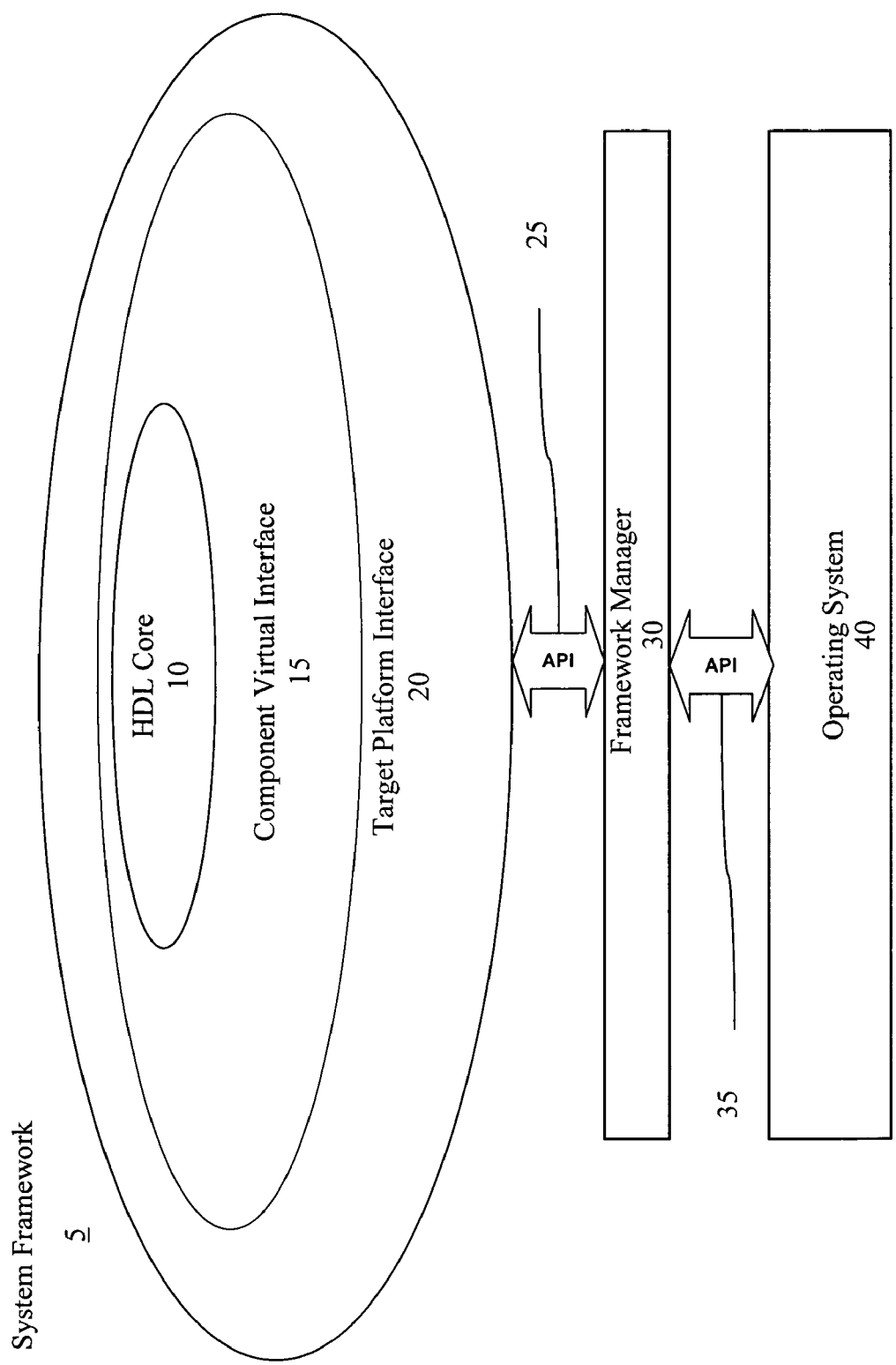
FIG. 1a is a top level perspective of certain elements configured in accordance with one embodiment of the present invention.

Referring to FIG. 1a, a top overview is presented, wherein the invention is a system framework 5 where the HDL core 10 is developed independent of chip or board. The dependency is built in as part of the framework 5 as described herein with coupling between the various elements. The HDL core application 10, may be written in a language such as VHDL or Verilog, and is specified as independent of the target hardware. A component virtual interface (CVI) 15 with a standard look, feel and form factor is a standardized and hardware-independent (board independent and FPD independent) shell that interfaces with the HDL core 10. A target platform interface 20 is a board specific wrapper that interacts with the component virtual interface 15. In one of the embodiments, these elements are implemented in a FPD 50 such as an FPGA.

Looking in from the outside, components formed from the HDL core 10 and the CVI 15 typically have the same look, feel and form factor, and adhere to the same common interfaces to enable communications with each other. The outer target platform interface 20 is board and FPD specific and binds the target hardware for which it was designed and talks to the API interface 25 which communicates with a framework manager 30 via some programming language such as a C or C++ code layer. The framework manager 30 manages the communications, control, and status of the components and also the modules inside the components and is not tied to any programming language. According to one embodiment the framework manager 30 has a hardware abstraction layer and operating system abstraction layer to provide a flexible and universal communicating mechanism.

The framework manager 30 communicates with an API interface 35 which in turn can communicate with any operating system 40 and the outside world. For example, the framework manager 30 can communicate to a Linux operating system via the API 35 and/or can communicate to an XP Windows operating system via a different API 35. These elements are generally implemented in software or a general purpose processor (GPP). A component development kit (CDK) provides the interface specifications that allow other developers to make compliant components thus promoting interoperability and code reuse. It should be apparent that the coding referenced as C and C++ is not restrictive and any language can be used, either now known or developed.

One of the goals of the inner shell Component Virtual Interface (CVI), 15 is to isolate the HDL core 10 from the target platform specifications that are board and FPD specific. The CVI 15 can have any number of resources and is not tied to any specific hardware, rather, it provides a mechanism to communicate to a specific type of hardware without the hardware being present. This is accomplished by defining a common HDL interface or shell herein termed the Component Virtual Interface 15 around the HDL core 10 to form a hardware-independent component and to isolate it from the target platform specifications. In one embodiment, the HDL core 10 implements some hardware-independent function based on input/output from virtual resources through the CVI 15 that replicates the hardware interaction. Thus, the HDL core 10 and the CVI 15 are hardware independent elements. The target specific outer shell or target platform interface (TPI) 20 is used to bind the hardware-independent elements, namely components, to some hardware.

Figure 1B:
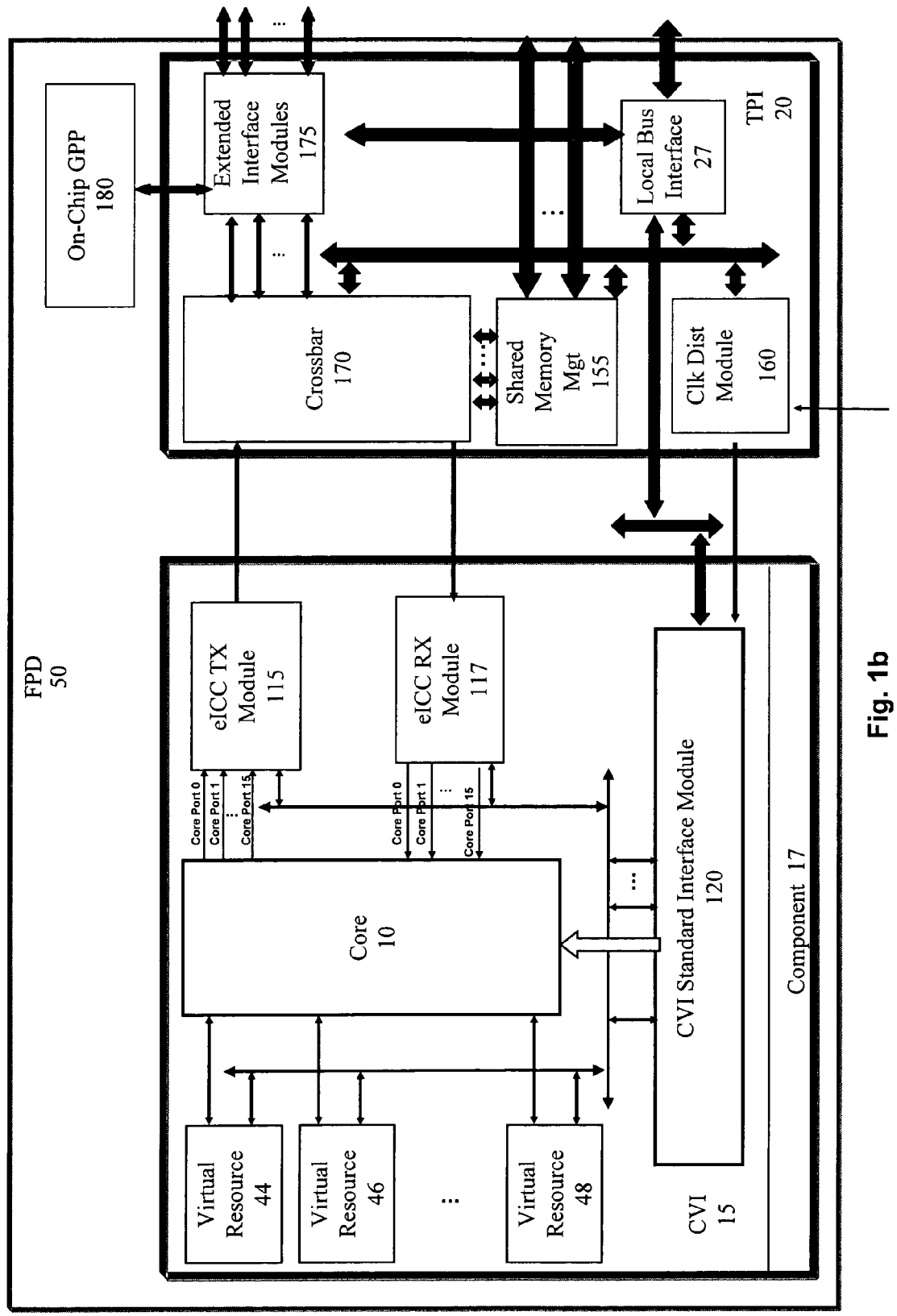
FIG. 1b is a more detailed top level functional diagrammatic perspective configured in accordance with one embodiment of the present invention.

A further overview perspective of the interface and elements of the present architecture according to one embodiment is presented in FIG. 1b. The basic framework has a core 10 and component virtual interface (CVI) 15 and target platform interfaces (TPI) 20. A component 17 is comprised of the core 10 and CVI 15 among other resources and is independent of the target board and has identical I/O specification and protocols as part of the standardization. The CVI 15 may be identical for all cores 10 and contain basic support engines that any given core 10 may require, however some cores 10 may only need a subset of the CVI engines or modules 15.

The HDL core 10 interfaces with the CVI board independent shell 15 and forms the component 17. Within the CVI 15 are any number of virtual resources 44, 46, 48, typically called engines or modules, that can be instantiated according to the design criteria and requirements. The HDL core 10 implements some functionality based on input/output from the virtual resources that mimics the hardware attributes. The core 10 communicates with a multitude of virtual resources 44, 46, 48 and the communications with the external world can be accomplished for a variety of functions. These resources 44, 46, 48 are the type of resources that any given FPD 50 such as an FPGA can provide on the chip. However, if the core 10 needs to communicate with resources or assets outside of the component 17 (external world) it communicates via the enhanced inter-component communications modules 115, 117. There can be any number of ports associated with the enhanced inter-component communications engines 115, 117.

The CVI 15 handles certain memory and virtual I/O communications requirements of the core 10 via dedicated engines, such as the CVI standard interface module 120, and the eICC modules 115, 117. CVI 15 also provides certain functionality necessary to all applications, such as controlling input and output data ports and protocol. Data can be communicated internally to other components or externally to the operating system, and each of the modules may have a unique address. The communications between components 17 is accommodated via the eICC modules 115, 117 using a common protocol along well-defined data ports or buses in the same language.

One of the features of the present invention is a protocol layer that has been added to the inter-component communications bus which shall be termed herein an enhanced inter-component communications (EICC) bus. The EICC-Bus is a versatile and robust protocol-based ICCbus with a multi-layer architecture to meet the portability and interoperability needs of Components. To distinguish the new ICC bus from the one described in U.S. patent application Ser. No. 10/303,441, the enhanced ICC bus shall be termed the e-ICCbus. However, it should be realized that e-ICCbus shall still be a point-to-point data transport vehicle.

As noted in this embodiment, there is an EICC transmission module 115 and an EICC receiver module 117. Both the EICC transmitter 115 and EICC receiver 117 modules also communicate with the crossbar 170 of the TPI 20 to facilitate communications outside of the component 17 and allow communications with the TPI 20 and the TPI resources.

The e-ICCbus in this embodiment shall consist of two independent modules: the e-ICCbus TX (Transmit) Module 115 and the e-ICCbus RX (Receive) Module 117. A Core 10 may have multiple e-ICCbus TX and RX modules 115, 117 and is not limited as depicted. For certain operations, such as memory operations, an e-ICCbus TX module 115 shall be paired with an e-ICCbus RX module 117 to form a full-duplex Memory Port. The e-ICCbus Module interface with the Core 10, for example, the signaling between a Core Port (In or Out) and the Core 10, shall be a super set of the ICCbus signaling. The eICCbus Transmit Module 115 can establish point-to-point and point-to multi-point (broadcast or multicast) communication.

Referring again to FIG. 1b, Components use the e-ICCbus to transfer data to and from each other and or TPI modules. As can be seen the e-ICCbus TX 115 and/or RX 117 module or a subset of either or both is present in the component or TPI module 20 in the path of data. These modules use the e-ICCbus signaling that is provided by the e-ICCbus Physical Interface Layer, i.e. Layer 0. A Core In Port is the physical interface between an e-ICCbus TX Module 115 and either a Core 10 or a Bridge Core inside a TPI Module 20. A Core Out Port is the physical interface between an e-ICCbus RX Module 117 and either a Core 10 or a Bridge Core inside a TPI Module 20. The e-ICCbus module according to one embodiment has three types of external interfaces, as follows: A. Inside a Component—Core Port Interface (Core In Port or Core Out Port); the CVI Standard Interface; and the e-ICCbus TX or RX Interface. B. Inside a TPI Module—Core Port Interface (Core In Port or Core Out Port); The TPI Standard Interface; and the e-ICCbus TX or RX Interface.

In general, the e-ICCbus Physical Layer provides signaling and handshake between e-ICCbus TX 115 and RX Modules 117, and between the e-ICCbus TX 115 or RX Module 117 and the Core 10 or the Bridge Core of a TPI Module 20 via the Core Port. Signaling includes communications between the e-ICCbus TX Module 115 or RX Module 117 and the CVI Standard Interface Control bus 120 (which is the component control bus) and the TPI Standard Interface 27 in the TPI Module 20.

While the CVI 15 is a hardware-independent shell, the TPI 20 is written specifically for a given FPD board 50 and contains all the hardware-specific information for the board assets such as memory, clocks, and FPD pin designations. The same TPI 20 can be used for all components 17 that operate or run on that specific FPD 50. There is a well defined interface connecting the CVI 15 and TPI 20 that allows for efficient communication exchange. The board dependent TPI interface 20 is coupled to the CVI 15, wherein the CVI standard interface module 120 communicates with the target platform interface (TPI) via the local bus interface 27.

With respect to communications between the TPI 20 and framework manager (not shown), these can be done via the API through a local bus interface 27. As shown in FIG. 1a and FIG. 1b the API is the layer between the TPI 20 and the framework manager 30 that links to the operating system 40 of the user.

Some of the functional aspects of the CVI 15 are shown along with the interconnections, such as the CVI bus arbiter 120; enhanced inter-component communications engines 115, 117; the shared memory management module 155; on-chip general purpose processor (GPP) 180; on-chip processor interface 183, clock distribution module 160; and extended interface modules 175 allowing communications with such features as analog-to-digital conversions (ADC), digital-to-analog conversions (DAC). The CVI 15 is a hardware independent shell that wraps the core and provides a level of abstraction from the external environment. The CVI 15 provides virtual assets such as memory management and communications that gives the core designer a degree of freedom as the core application needs no knowledge of assets external to itself. Therefore, the designer only has to focus on the function rather than the interface and memory, other cores or the system bus. However, the core must abide by a predetermined set of I/O ports present in a template that is mapped as the core application interface. These CVI functional blocks are described in further detail herein.

Figure 1C:
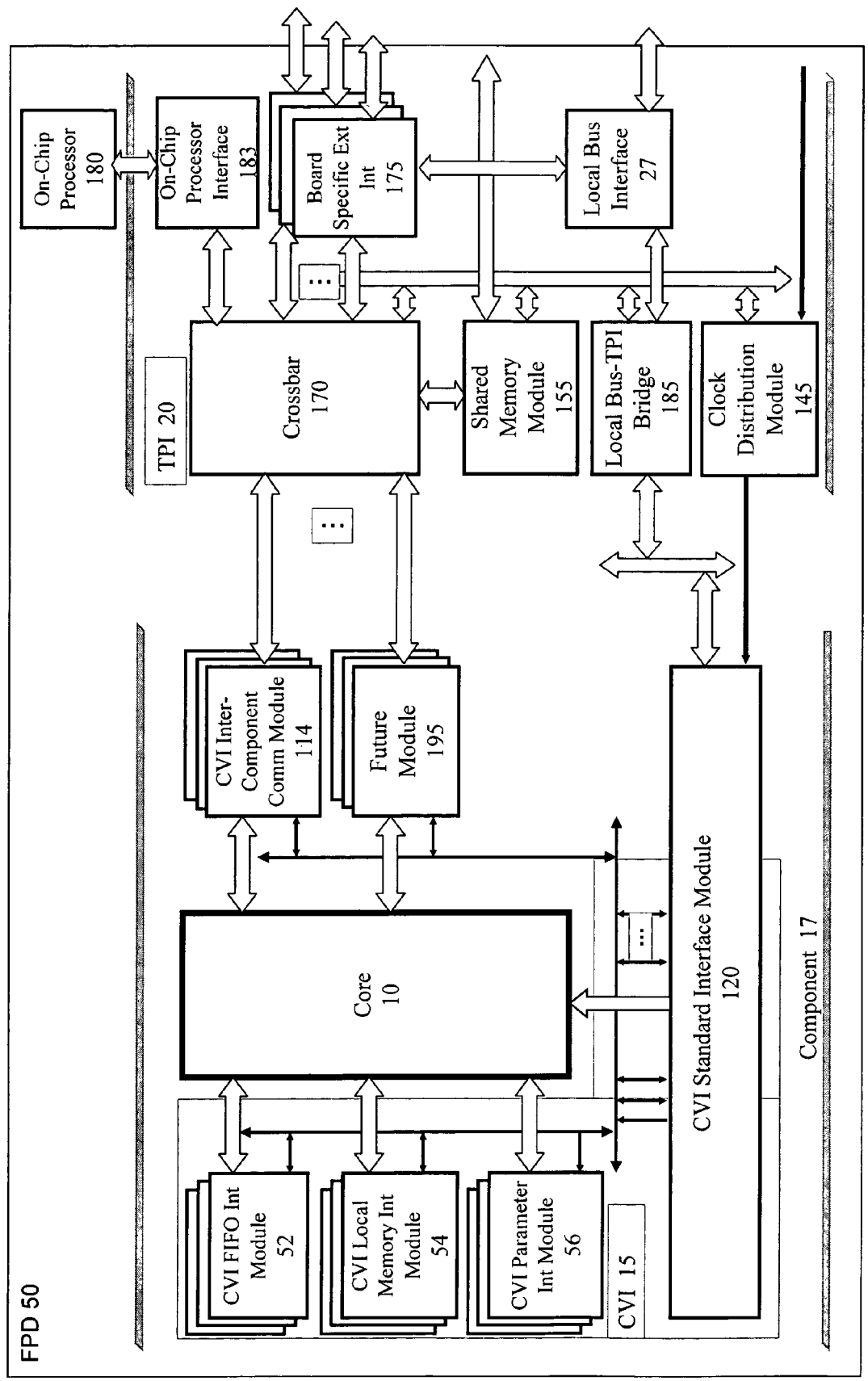
FIG. 1c is a further detailed top level functional diagrammatic perspective configured in accordance with one embodiment of the present invention.

Referring to FIG. 1c, a further detailed perspective of the present invention is depicted according to one embodiment of the invention. As previously described, the core 10 is coupled to the CVI 15 in such a manner that they form a hardware-independent component 17. The target dependencies are part of the target platform interface (TPI) 20. In this embodiment, there are certain virtual resources that are defined such as CVI FIFO interface module 52, CVI local memory interface module 54, and CVI parameter interface module 56 which are instantiated on chip and are coupled to the core 10. The CVI standard interface module 120 provides one communication path to the TPI resources and also processes clock information from the clock distribution module 145. The CVI inter-component communications (ICC) module 114 provides an efficient communications mechanism with the crossbar 170 and is detailed in further detail herein. As shown, future modules 195 can be easily implemented into the component 17.

The interrelationship between the CVI 15 and the TPI 20 is depicted, wherein the functionality of the TPI 20 includes such resources as the scaleable crossbar 170; board specific external interface 175; memory module 155; a local bus-TPI bridge 185; local bus interface 27; on-chip processor interface 183; and clock distribution module 145. There can be any number of additional resources available for additional functionality. the shared memory management module 270; on-chip general purpose processor (GPP) 180; clock distribution module 160; and extended interface modules 175 allowing communications with such features as analog-to-digital conversions (ADC), and digital-to-analog conversions (DAC).

The TPI 20 is coupled to the component 17 and the resources therein. In one embodiment, to communicate with processor(s) 180 on the FPD, such as a RISC processor, one or more on-chip microprocessor interfaces 183, are integrated on the TPI 20. The internal chip communications with the on-chip GPP interface 180 allows one or more of the modules to communicate with the on-chip GPP 180 by direct communication. Thus, without changing architecture the functionally of the embedded GPP 180 can run functions such as the framework of the present invention and may even include its own internal operating system. According to one embodiment, the internal GPP 180 can run the framework manager system on the on-chip GPP which can be coupled with the TPI 20.

Depending on the communication specifications of the on-chip GPP 180, a communication bridge module 183 can be designed as a TPI module to connect the on-chip GPP 180 to the Crossbar 170, and the Local Bus interface 27. It should be noted that the present invention is not limited to the GPP 180 but can also include digital signal processors (DSPs).

According to the depicted embodiment, for each component there is one CVI 15 with multiple engines 52, 54, 56. Therefore, some type of address management is typically performed by the CVI bus arbiter also called CVI standard interface module 120. The CVI standard interface module 120 is the interface between the CVI Bus and the TPI and makes internal CVI engines accessible to the operating system (OS). The TPI 20 encodes the CVI engine addresses and their respective registers in the address/data bus and the CVI standard interface module 120 extracts the address and places it on the internal address buses.

In one embodiment, the addressing modes of the local memory interface module 54 support both directed and automatic modes. Directed mode is when all addresses are created by the core and transmitted to the memory through the address bus. In the automatic mode the memory module 54 generates the required memory address.

Within the CVI standard interface module 120 are registers that store various operating data characteristics, including status registers. Once a component is developed, it is assigned a unique part number termed the component identification number. The identification number and various configuration management data is then associated to the identification number. The component identification number allows accessibility from the operating system to monitor status, health, and to effect the operational characteristics such as power save. The identification number is also used for communication with the TPI.

The CVI inter-component communications module 114 generally controls the flow of data between different components whether on the same FGPA chip or on another chip. This allows an application to pass data to another component without needing to know the exact communication mechanism. A crossbar switch 170 on the TPI 20 does the connections, although components may be connected to each other directly. There are several protocol options including serial and parallel for the component communications. Components 17 can communicate via various supported protocols, and in particular, serial communications is one of the modes, especially for components on different FPDs. The e-ICCbus 114 uses an advanced protocol which will be described elsewhere. The data exchange between components can be achieved via the TPI crossbar 170 with or without FIFO's in the path or through the external memory depending upon the mode selected and the resources.

Auxiliary functions are also within the scope of the present invention such as the performance monitor. The performance monitor module checks the health of portions of the hardware and provides fault tolerance mechanisms to monitor health of the elements. Prior performance monitors typically have status indications to check the integrity of the various components, and polling in a round robin fashion or interrupt scheme as is known in the art.

Another auxiliary function is power management that can be incorporated to decrease non-essential certain core functionality in order to manage power. Certain functions that are not needed for a given core are shutdown to increase power longevity, especially when the power source is limited.

While the component itself is independent of the target hardware, operating system and platform, some knowledge about the hardware is typically required to run the functions on some given hardware. The general structure of a FPD board is known to typically have a bus interface, bus controller, clocking, memory, and data connection, among other resources. Boards may also incorporate some form of dependency into the FPD and require complex integration to mate and communicate with the overall system and other various FPD's. The TPI 20 is usually specific to the FPD chips on the board, wherein the chip can be from any of the manufacturers, such as Xilinx or Altera, having different gate densities and different I/O counts, and different internal architectures. In general terms, the TPI 20 binds to the specific on-chip resources such as built-in clock management resources some FPDs have, essentially making the components independent from the chip specific details. The TPI 20 also binds to a board's system bus (such as PCI and VME) and other on-board assets such as analog-digital converters, essentially making the components independent from the board specific details.

According to one embodiment, the TPI 20 of the present invention has been re-structured into an organization that handles all communications including on-chip, off-chip and external communications. Any hardware specifics are put into TPI whether the hardware specific parts are on the same board or outside the board. Functions previously identified as being Chip TPI and Board TPI have been consolidated into the common architecture depicted herein.

The e-ICCbus protocol employed by the CVI inter-component communications module 114 is described further herein and is defined to support a point-to-point, or point-to multi-point unidirectional high speed and efficient data transport for communications between components 17 on the FPD, resources, software applications, and also external components and resources via a local bus such as the board specific external interface 175, or an external data fabric such as Rapid IO. The e-ICCbus provides such features as packet-based data transmission, variable packet (frame) size, multi-dimensional data transmission capability, side channel transmission capability for SIGINT applications, data and address transmission capability for memory applications, unidirectional with asynchronous yet deterministic, locked handshake between source and destination, synchronous packet transmission, and little Endian or big Endian format among other services.

The point-to-point connectivity of the e-ICCbus does not preclude it from establishing multi-cast or broadcast connections. As used herein, the term e-ICCbus is used to define features and protocols, and it applies to other manifestations of the e-ICCbus, including the 32-bit, the Wide e-ICCbus, and the Double Wide e-ICCbus. Furthermore, the e-ICCbus can be deployed in any of the various standards such as a 32-bit, 64-bit, or 128-bit bus. The protocol for all the deployments is basically the same and can further include Parity (odd or even) or checksum for error checking.

According to one embodiment, the e-ICCbus transports data in frames. Each frame consists of leading headers with data identifiers, and a variable number of Payload Beats. The Payload Beats are a succession of one or more data dimensions. The concept of data dimensionality is a feature of the e-ICCbus. For example, in a memory operation, address and data form two dimensions of the same data stream. Another example is a Time-Sampled Data and its Time Tags. The Time Tags form the second dimension of the Data Stream. It should be readily understood that a data stream may consist of many dimensions.

By way of illustration, components in a system can be considered as processing nodes distributed on FPGAs on multiple boards, connected via multiple data fabrics, each potentially with a different architecture (e.g. Serial Rapid IO, RACE++, PCI-X), then one can see that embedding the synchronization information, such as Universal Time Code (UTC), as a data dimension inside the data stream will remove any dependency on the data fabric architecture.

It should be noted here that unless connected directly to such elements as an ADC or DAC, the processing elements are often asynchronous to the sample clock. The data fabrics employed in distribution of data are also asynchronous to the sample clock. To achieve portability, any dependency of the component to the sample clock should generally be avoided. The e-ICCbus protocol typically assumes that a component operates asynchronously to the sample clock.

The concept of data dimensionality is well suited for SIGINT applications, where alignment of coherent data with known points of the time domain, alignment of channels, and/or association of data with some trigger or request are required and the information pertinent to each can be assigned to a data dimension and transported in the data stream.

Another rationale to include timing references as a data dimension is in cases of large algorithms. When an algorithm is too big to fit on one FPGA, it can be partitioned into either multiple components, or a combination of various types of components running on multiple processing elements. These partitions pass data to each other and may require knowledge of the synchronization and timing relationship of the data points. In addition, the ability to synchronize multiple channels of data as detailed herein enhances applications such as direction-finding, geo-location, and beam-forming.

Thus, embedding synchronization information inside the data stream of the e-ICCbus gives components the ability to process the data asynchronously while maintaining association to the time domain reference and provides data flow independence from data fabric architecture allowing multiple data channels flowing through different processing elements on different processing boards while maintaining synchronization with each other.

Figure 2A:
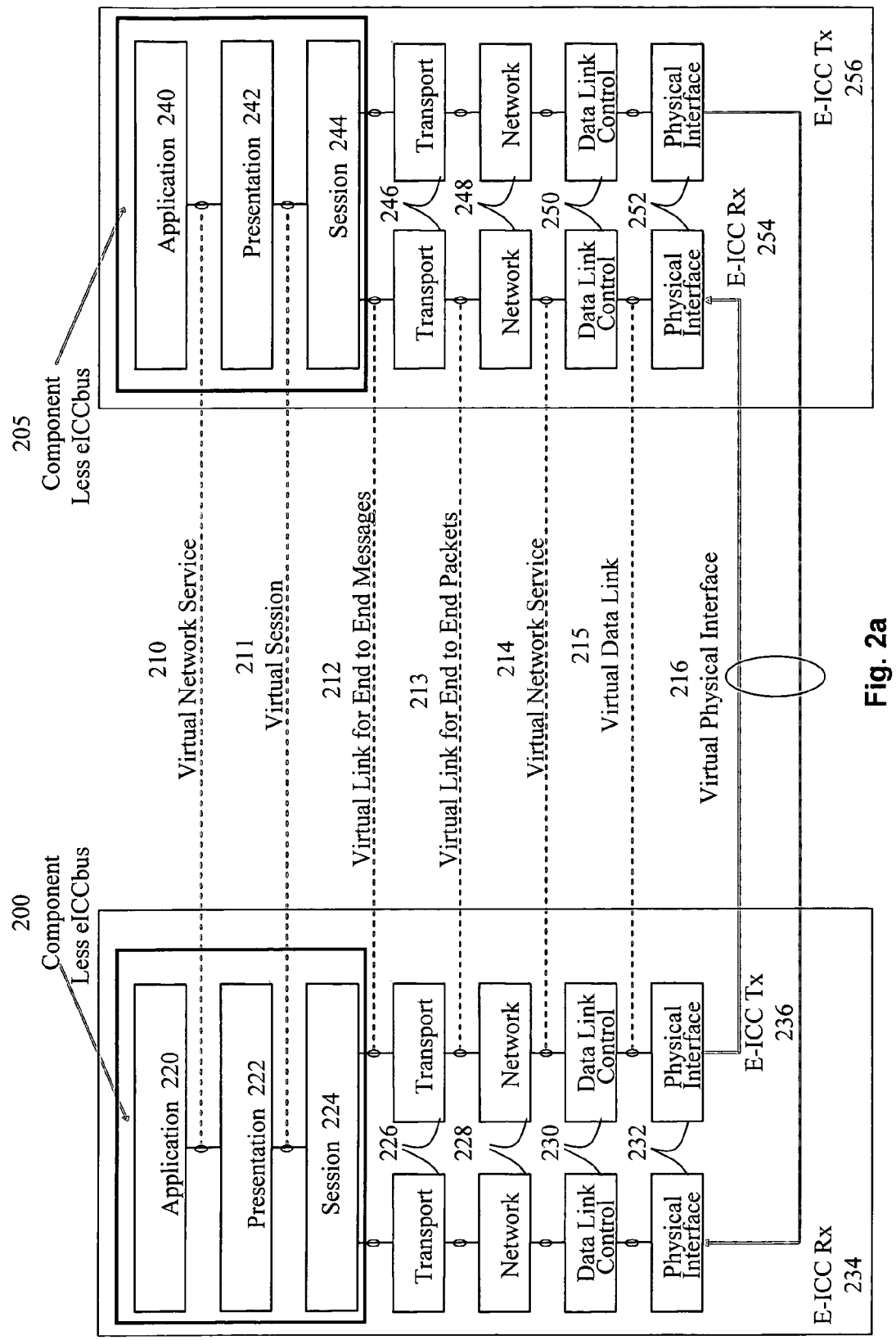
FIG. 2a shows a presentation of the enhanced inter-component communications (EICCbus) configured in accordance with one embodiment of the present invention.

According to the embodiment illustrated in FIG. 2a, two components are shown 200, 205. The use of two components is for illustrative purposes and may include any number of components communicating with each other. Virtually all networks are based in some fashion on the Open Systems Interconnection (OSI) standard which was developed by the International Organization for Standardization. The OSI is a standard reference model for communication between two end users in a network and is used in developing products and understanding networks. OSI divides telecommunication into seven layers that define the different stages that data must go through to travel from one device to another over a network.

Within each component 200, 205 are the various elements or modules including Layer 7 application modules 220, 240 with a corresponding virtual network service 210 providing communications. This Layer 7 actually interacts with the operating system or application whenever the user chooses to transfer files, read messages or perform other network-related activities.

There are Layer 6 presentation modules 222, 242 having a virtual session 211 communicating therewith. Layer 6 takes the data provided by the Application layer and converts it into a standard format that the other layers can understand. In Layer 5, session modules 224, 244 have a virtual link for end to end messages 212 that provides communications between these modules. Layer 5 establishes, maintains and ends communication with the receiving device.

The e-ICCbus protocol spans four layers of the 7-Layer OSI Reference Model which is typically termed the Transport Set and is shown in FIG. 2a. These layers include the Layer 3—Transport Layer, Layer 2—Network Layer, Layer 1—Data Link Layer; and Layer 0—Physical Layer, wherein each layer is described in detail herein.

Layer 3 is the transport layer and includes the transport modules 226, 246 which manages the end-to-end control and error-checking. This layer maintains flow control of data and provides for error checking and recovery of data between the devices. Flow control means that the Transport layer looks to see if data is coming from more than one application and integrates each application's data into a single stream for the physical network. These Layer 3 modules 226, 246 communicate via the virtual link 213. It ensures complete data transfer and is responsible for Payload Virtual Transport. The following operations, as examples, are performed in this layer, Data Formatting such as zero extending or sign extending data (TX Module); Data Format Stripping (De-formatting) (RX Module); Data Packing (TX Module) or Unpacking (RX Module); and Data Queuing in Dimensional Data Transmit (TX Module) or Receive (RX Module) FIFO's.

Layer 2 is the Network Layer and includes network modules 228, 248 and handles the data routing (sending it in the right direction to the right destination on outgoing transmissions and receiving incoming transmissions at the packet level). The network modules 228, 248 are coupled by a virtual network 214. This layer manages the way that the data will be sent to the recipient device and includes logical protocols, routing, and addressing. The network layer does routing and forwarding and can also serve for connectionless based communications, context switching application, and auto-routing applications to name a few.

Layer 1 is the Data Link Layer and provides synchronization for the physical level and performs such functions as bit-stuffing operations. The data link control modules 230, 250 are coupled by a virtual data link 215. Within this layer, the appropriate physical protocol is assigned to the data along with the type of network and the defining of the packet sequencing. It furnishes transmission protocol knowledge and management. This layer is responsible for Payload Structure Information and bridges the virtual and physical transport worlds. Organized in Headers and Common Payload Identifiers (CPI), the Payload Structure Information includes the following: Payload Structure Format and Dimensional or Structured Data. The Data Types include Binary, Signed Integer, Unsigned Integer, 2's Complement, and Floating Point (IEEE 32, IEEE64, and Block) and ASCII. This section includes the Size of Natural Data (e.g. 36 bits for I & Q), Dimension Descriptors for dimensional data, and Application Designator. From a functional perspective, the Layer 1 functions include Primary Header Formation (TX) or Interpretation (RX); Data Dimension Header Formation (TX) or Interpretation (RX); CPI Appending (TX) or Separation (RX); Checksum or Parity Generation (TX) or Error Checking (RX); Data Transmission Scheduling (TX) or De-interleaving (RX).

Layer 0 is the Physical Interface Layer. This layer conveys the bit stream through the network at the electrical and mechanical level. It provides the hardware means of sending and receiving data on a carrier This layer is responsible for signaling and handshake between e-ICCbus modules. The physical interface modules 232, 252 are coupled by a virtual physical interface link 216. This is the level of the actual hardware and defines the physical characteristics of the network such as connections, voltage levels and timing.

Figure 2B:
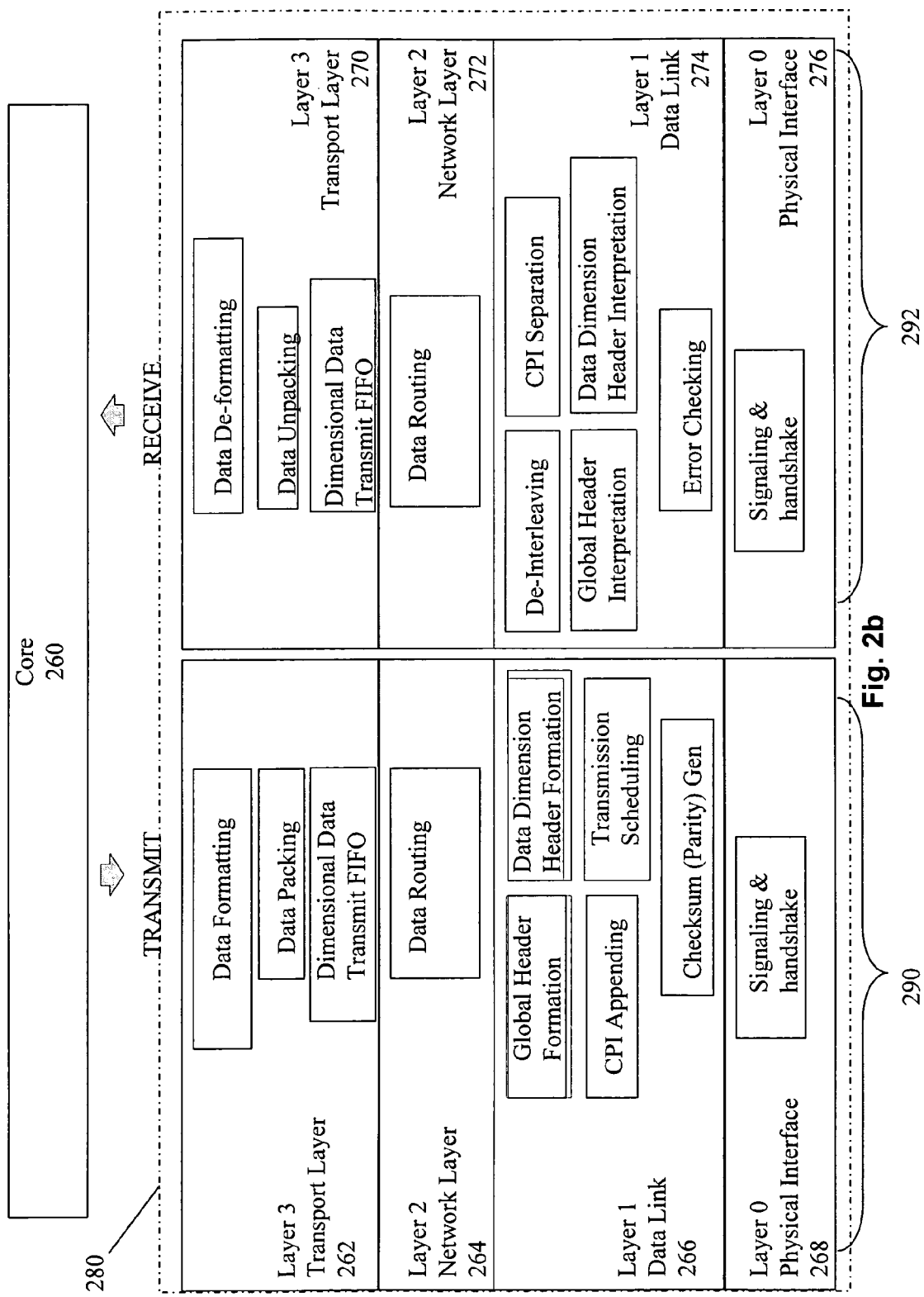
FIG. 2b shows a presentation of the enhanced inter-component communications (EICCbus) configured in accordance with one embodiment of the present invention.

Referring to FIG. 2b, the details of each eICCbus module layer is further presented according to one embodiment of the invention. The e-ICCbus Module 280 is generally provided in both the CVI and TPI libraries. The e-ICCbus Module 280 being part of the CVI is available in the CVI library for reuse. Because TPI modules communicating with Components use the same physical layer and possibly additional layers of the e-ICCbus module, it makes sense to provide the same source code in the TPI library as well. Depending on the module or Component's needs the functions in each layer will be customized to fit them, and one or more layers might be omitted altogether as shown in Table 1 for one embodiment of the invention.

TABLE 1 e-ICCbus Module Layers

| Layer | Layer Description | CVI | TPI Crossbar | TPI Module |
|---|---|---|---|---|
| 0 | Physical Interface Layer | Yes | Yes | Yes |
| 1 | Data Link Control Layer | Yes | No | Yes |
| 2 | Network Layer | No | No | No |
| 3 | Transport Layer | Yes | No | Yes, Application Specific Code |

The core 260 communicates with the e-ICCbus Module 280 that has an e-ICC TX module 290 and an e-ICC RX module 292. Every e-ICCbus module is generally discoverable at runtime, by means of readable registers that provide salient information about the Module to the Framework Manager. The type of an e-ICCbus Module, i.e. whether it is a Transmit or Receive Module, is hardwired at design time, and identifiable at discovery. An e-ICCbus Module is uniquely identifiable in a system, and the Framework Manager is allowed to assign a run-time e-ICCbus Module Logical Address to each e-ICCbus Module.

Components use the e-ICCbus to transfer data to and from each other and or TPI modules. As can be seen, the e-ICCbus TX 290 and/or RX module 292 or a subset of either or both is present in every component or TPI module in the path of data. The components use the e-ICCbus signaling that is provided by the e-ICCbus Physical Interface Layer 268, 276, i.e. Layer 0.

In general, the e-ICCbus Physical Layer provides signaling and handshaking between e-ICCbus TX and RX Modules; between the e-ICCbus TX or RX Module and the Core or the Bridge Core of a TPI Module via the Core Port; and signaling between the e-ICCbus TX or RX Module and the Control bus. The Control bus in a Component is the CVI Standard Interface, and in a TPI Module is the TPI Standard Interface.

As noted herein, the e-ICCbus module has three types of external interfaces. The external interfaces inside a Component include: Core Port Interface (Core In Port or Core Out Port); The CVI Standard Interface; and the e-ICCbus TX or RX Interface. The external interfaces inside a TPI Module include: Core Port Interface (Core In Port or Core Out Port); the TPI Standard Interface; and the e-ICCbus TX or RX Interface.

Every e-ICCbus Module has a Logical Address R/W register, such as 32-bit. The e-ICCbus Module Virtual or Logical Addresses can be used to establish connectionless transport mechanisms.

The e-ICCbus module according to one embodiment has three types of external interfaces, as follows: A. Inside a Component—Core Port Interface (Core In Port or Core Out Port); the CVI Standard Interface; and the e-ICCbus TX or RX Interface. B. Inside a TPI Module—Core Port Interface (Core In Port or Core Out Port); The TPI Standard Interface; and the e-ICCbus TX or RX Interface. The width of a Core In Port or a Core Out Port is a Generic and programmable at design time, and can range, for example, from 1 to 512 bits. Furthermore, the number of Core Ports in any e-ICCbus Module is a generic and programmable at design time, from, for example, 1 to 16.

Every Core Port in an e-ICCbus Module has a unique ID, such as a 4 bit ID. Any data set with a common type, bit width, etc constitutes a Data Element. Any well-defined data set, made up of one or more Data Elements and provided to a Core Port constitutes a one-dimensional data. The number of Data Elements in any Dimensional Data is a Generic, programmable at design time, and does not exceed 256. The Core Port ID is by default the same as the Data Dimension ID. The number of e-ICCbus Modules in a component is a Generic, programmable at design time, and in one embodiment does not exceed 16.

For communications between the e-ICCbus TX Module Interface with an e-ICCbus RX Interface, when a communication channel is established between a TX e-ICCbus and a RX e-ICCbus, a handshake process locks the two ends of the channel for data transfer.

The next layer is the Data Link Layer 266, 274. The data link layer 266 of an e-ICCbus TX Module prepares data for Transmission by forming Headers and Common Payload Identifiers, appending Payload Identifiers to the Data Payload, Scheduling Transmission of Data which may include Dimension Interleaving, and generating a Parity bit or checksum for error detection. The Data Link Layer 274 of an e-ICCbus RX Module checks for error in the received Payload, interprets the Headers, extracts Dimensional Data and send them to the Transport Layer. A Payload typically consists of a Common Payload Identifier (CPI) and either a Header or Dimensional Data for the e-ICCbus, Wide e-ICCbus, and Double Wide e-ICCbus.

The first Frame transmission typically begins with a Primary Global Header and ends with the last Payload of the data stream. An example of the order of the elements in one embodiment is as follows: 1) Primary Global Header; 2) Secondary Global Header; 3) Primary Header for First Data Dimension; 4) An Auxiliary Header for each Data Element in the Data Dimension; 5) Primary Header for Second Data Dimension if applicable; 6) An Auxiliary Header for each Data Element in the Second Data Dimension; 7) For each additional Data Dimension repeat steps 5 and 6; and 8) Dimensional Data.

According to one embodiment, there generally are at least 8 Payload Beats in addition to Headers in each Frame. For improved bandwidth utilization, the application is able to command e-ICCbus to transmit only the Primary Global Header followed by Data for all the frames following the first one.

There is typically a field in the Primary Global Header identifying the makeup of the frames following the first frame. The e-ICCbus Transmission may begin with a Header called the Primary Global Header. The concatenation of the e-ICCbus Module Component ID and the e-ICCbus Module ID is termed the e-ICCbus Module Virtual Address. The e-ICCbus Module Virtual Address can uniquely identify an e-ICCbus Module in a system.

The first frame in every e-ICCbus data stream generally employs a Header called the Secondary Global Header (SGH) that follows the Primary Global Header. The e-ICCbus TX Module has a Global Header Formation Block (GHFB) to generate Primary and Secondary Global Headers prior to transmission of any frame. The GHFB calculates the Frame Size from the information provided by the Data Dimension Header Formation Blocks and the e-ICCbus registers. The GHFB provides either both Primary and Secondary Global Headers or just the Primary Global Header.

The e-ICCbus RX Module uses the CPI and the fields of the Global Headers to capture the information such as bus size, component system ID, e-ICCbus Module ID, frame composition, number of data dimensions, frame size, data order, and application ID. The e-ICCbus RX Module generally loads a Payload Counter with the frame size value to keep track of the number of valid payloads received.

Each Dimensional Data has a Primary Header, and as many Auxiliary Headers as there are Data Elements in that Dimension. When there are multiple Data Elements in a Dimensional Data Unit, they are provided to the respective Core Port either as a concatenated series when the Core Port Width equals the total bit widths of all data elements or each Data Element may appear individually at the Core Port for each clock cycle with Data Element 0 leading the pack The e-ICCbus TX Module has a Dimensional Data Header Formation Block (DHFB) for each Data Dimension to generate Primary and Auxiliary Headers for that data dimension prior to transmission of any frame. The DHFB calculates the number of Data Dimension Payloads from the information provided by the Core Ports and the e-ICCbus registers. The DHFB provides Primary and Auxiliary Headers based on an input from the Transmission Scheduler.

The e-ICCbus RX Module uses the CPI and the fields of the Dimensional Data Headers to capture the information for each data dimension. Typical information includes the number of different data elements in the data unit, format type, total number of data units per frame, data order, header ID, data element size, data element type, and data unit size.

The e-ICCbus TX Module generates the CPI for each Data Dimension, excluding the Parity field, and appends it to each valid bit data payload of the corresponding dimension.

The e-ICCbus RX Module strips the CPI from received Data Payload and uses it to route the incoming payloads to their respective Dimensional Data Receive FIFO's.

The e-ICCbus TX Module has a Transmission Scheduler to handle orderly transmission of Headers and Data Payloads. An e-ICCbus TX transaction has a header phase followed by a Payload phase. The header phase consists of single or multiple Header Beats. The Payload phase consists of single or multiple Payload beats belonging to one or more dimensions. For example, a simple Transmission scheduling is when there is only one data dimension in the payload. In general, transmission scheduling is application-dependant. The Transmission Scheduler supports sequential transmission of Dimensional Data, round robin transmission of Dimensional Data, and priority based transmission of Dimensional Data without dropping data from any dimension.

The e-ICCbus is the main gateway of a component to the TPI, thus according to one embodiment the maximum bandwidth of the e-ICCbus is determined by the TPI's target hardware. This might seem at first to contradict the assertion that a Component is hardware-independent, but it does not. The e-ICCbus module is hardware-independent, but since all components are integrated into a bit-map file for a chosen FPGA, it is assumed that the Component designer evaluates the data rate requirements of his/her component and targets a device that is capable of meeting its timing.

The e-ICCbus RX module has a Data De-Interleaving Block to route the Data Payloads to separate bins (Dimensional Data Receive FIFO's), one bin per Data Dimension.

The e-ICCbus TX Module has a Parity (or Checksum) Generation Block to generate a parity bit (odd or even) or checksum for each payload and reflects it on the parity (or checksum) field of the CPI at each Payload Beat. In one embodiment of the invention, the e-ICCbus TX Module generates an odd parity bit. In one embodiment of the invention, the e-ICCbus RX Module has a Parity Check Block to generate an odd parity bit for each payload received excluding the parity field of the received payload and compare the two parity bits to ensure the integrity of received payload.

In a TPI module, the Layer 3 Transport Layer 262 will typically be application specific and may be hardware-dependant. In other words, it is expected that unlike a Component, for a TPI module that uses Transport Layer function, the Layer 3 code will be unique and dependant on the TPI module's external interface characteristics.

On the transmit side, the layer 3 transport layer 262 encompasses several signaling functions including data formatting, data packing, dimensional data transmit FIFO. The Transmit Layer of an e-ICCbus TX Module is responsible for formatting of Dimensional Data, e.g. sign or zero extending the data, packing it into Payloads that fit the bus width, and sending it to the proper FIFO in the Data Link Layer.

The Transmit Layer of an e-ICCbus RX Module de-packetizes data received from the Data Link Layer, strips formatting information, and routes it to the destination Core Port. A Core may provide data of different widths to a Core Port. When the data width does not match the e-ICCbus width, the data is sign or zero extended to either match the bus width or fit in multiple bytes. The formatting block is typically a generically defined module.

The e-ICCbus RX Module may have a Data De-Formatting Block to restore the received zero or sign-extended data to its original form. For a dimensional data that is sign or zero extended to the next higher byte boundary or to the bus width boundary, the Data De-Formatting Block restores the data to its original Data Unit Width as identified in the Dimensional Data Auxiliary Header.

Ultimately the Core In Port Data of an e-ICCbus TX module winds up at the Core Out Port Data of an e-ICCbus RX Module. If both the Core In Port and Core Out Port of the respective modules have the same width, then the format stripped data width will match the Core Out Port width by definition. However, if the Core Out Port has a smaller width than the Core In Port, then another service will be required in the Transport Layer of the e-ICCbus RX module to deal with that appropriately.

The e-ICCbus TX Module has a Data Packing Block to split a Dimensional Data Unit with a width different than the e-ICCbus width for optimal use of the communication bandwidth. The e-ICCbus RX Module has a Data Unpacking block to restore the received packed Dimensional Data to its pre-packed form.

The e-ICCbus TX module has a FIFO, heretofore called the Dimensional Data Transmit FIFO (DDT FIFO), for each Dimensional Data provided by either the Data Formatting Block or the Data Packing Block. The depth of the DDT FIFO is typically determined by a generic at design time. The e-ICCbus RX module has a FIFO, heretofore called the Dimensional Data Receive FIFO (DDR FIFO), for each Dimensional Data provided by the Data De-interleaving Block. The depth of the DDR FIFO is determined by a generic at design time.

The e-ICCbus protocol also enables multi-cast and broadcast of data. For example, suppose there are three identical Components each generating 8 bins of data from a different antenna source. Each bin is identified as a Data Dimension 0 to 7, and transmitted on the e-ICCbus of the respective Component. Suppose also that there are eight Components each receiving data from the three previously described components. Once the multi-cast connection is configured by the Crossbar, each Receiving component can use the CPI of the payloads to parse the data dimension and only pick up the ones it needs to perform its function, e.g., receiving Component 0 takes Bin 0 of all three transmitting components and ignores the other bins.

Figure 3:
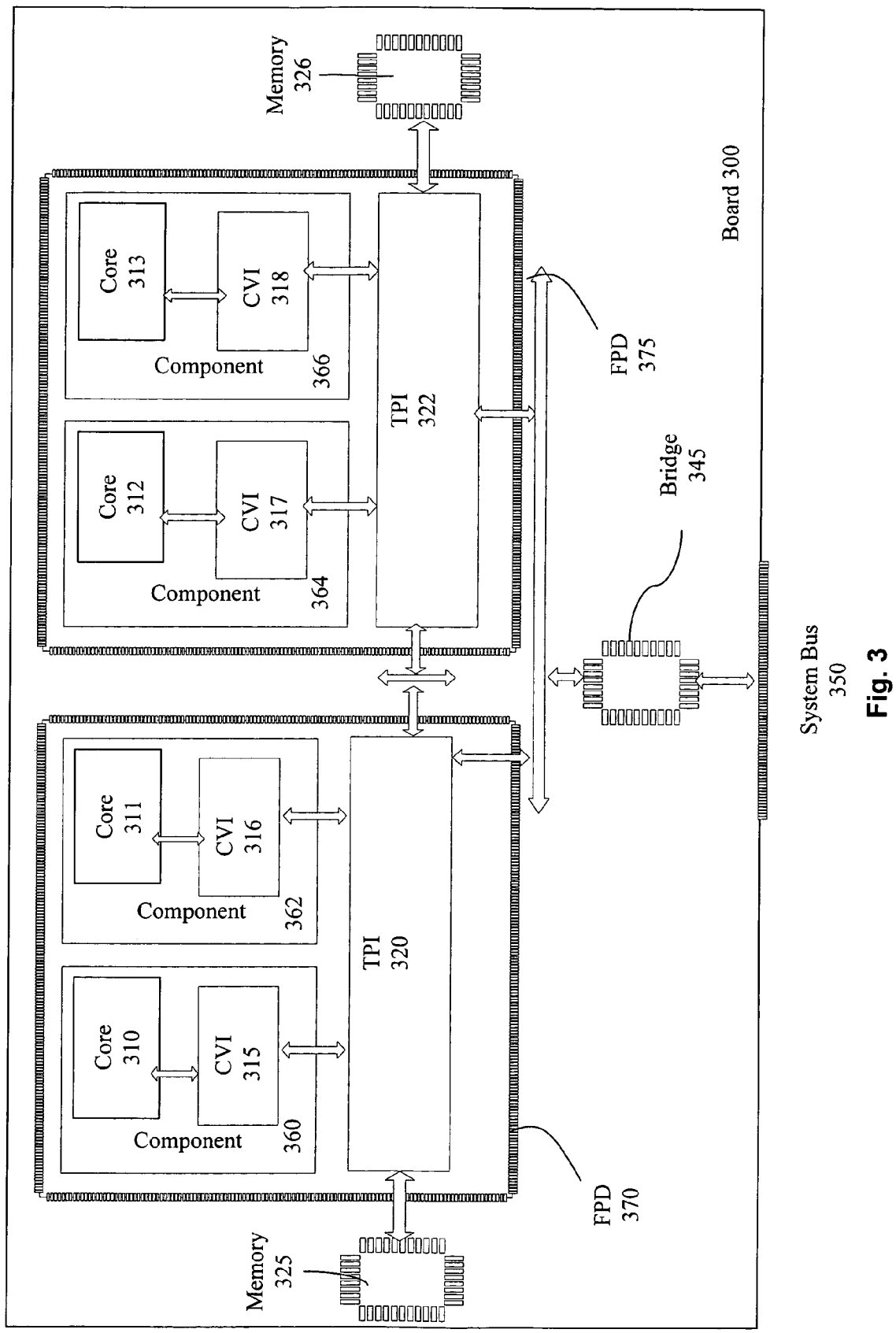
FIG. 3 shows a presentation of a board with two FPGA devices and the interconnections and elemental breakdown of the devices configured in accordance with one embodiment of the present invention.

A top level diagrammatic perspective of the architecture for a further embodiment is shown in FIG. 3 showing two components 360, 362 on a first FPD or chip 370, and two components 374, 376 on a second chip 375. Both chips 370, 375 are resident on a single board 300 along with the additional elements and resources. It should be understood that there can be many components on a chip and many chips on a board. In this embodiment, the board 300 has a first FPD 370 and second FPD 375 having respective TPI 320, 322 that each interface to the bridge 345 thereby gaining access to the system bus 350.

The TPI 320, 322 from each FPD 370, 375 manages the respective on-chip resources and also communicatively couples between the FPDs 370, 375, which among other advantages allows an efficient allocation of resources. The TPI 320, 322 manages certain resources of each chip and acts to bind the components 360, 362, 364, and 366 to the respective FPD's physical parameters. It enables different components, whether on-chip or off-chip to pass data to each other via switching mechanisms. And, when two or more components attempt to access the same on-board resource at the same time, there can be arbitration based on pre-allocated priorities that may be changed at run-time to manage access to the resource properly.

In one embodiment of an FPD board 300 there may be "left" and "right" nomenclature for memory sections of the external memory blocks 325, 326. The use of the left and right nomenclature is merely for descriptive purposes relying upon the legacy naming conventions and is not to be construed in any way as limiting the memory blocks of the present invention. Note that the memory is not limited to two memory banks 325, 326 and any number and sized memory can be deployed.

As previously indicated, the CVI local memory interface engines handle local memory requirements for on-chip memory applications and allow for internal memory storage on the chip for smaller memory tasks and are parametrically reconfigurable in width and depth to meet the core requirements. In addition, if not required, each memory block can be placed into a power save mode or used by other components via the shared memory management module. For applications that require larger memory resources, the external or off-chip memory 325, 326 can be used.

Referring again to FIG. 3, the CVI 315, 316, 317, 318 isolates the core 310, 311, 312, 313 and serves as the buffer between the generic HDL core function 310, 311, 312, 313 and the more board specific TPI 320, 322 interface. It should be understood that a component 360, 362, 364, 366 is typically the integration of the HDL core function 310, 311, 312, 313 of an application with the CVI 315, 316, 317, 318. The application 310, 311, 312, 313 itself is not a component 360, 362, 364, 366 and neither is the CVI 315, 316, 317, 318 itself, but rather the integration of these elements creates a component 360, 362, 364, 366. The component 360, 362, 364, 366 is modular and may be unaware of other components or its environment. The component 360, 362, 364, 366 implements functions, accepts input, and produces output. The components 360, 362, 364, 366 are controllable by runtime parameters and allow an adaptable and maintainable structure and standardized interfacing. In this manner, the components 360, 362, 364, 366 have added reusability and are easily combined with other components to permit varied requirements and redundancy as well as interoperability and code reuse.

Figure 4:
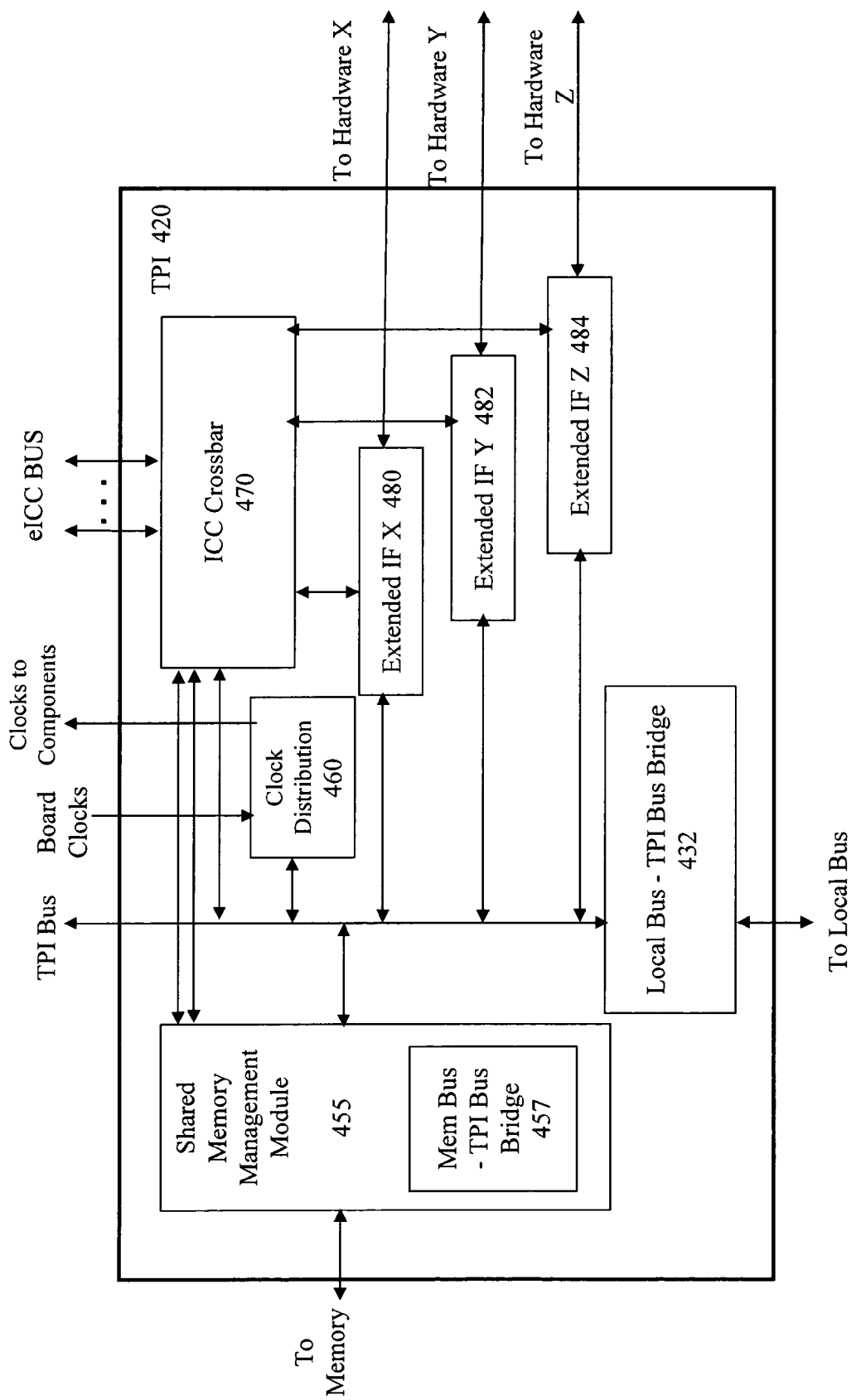
FIG. 4 illustrates the TPI structure and connections configured in accordance with one embodiment of the present invention.

One embodiment of the TPI 420 is detailed in the block diagram perspective of FIG. 4 that serves to bind the component to the FPD's physical I/O and memory and interfaces to the TPI 420. This allows different components, whether on or off chip, to pass data to each other via the crossbar 470. The TPI 420 can be thought of as the "glue" that binds the hardware independent components to the FPD and provides the physical connection to external memory, other components, and a TPI interface.

According to this embodiment, there is an local bus Mux interface 430, a crossbar 470 to manage connectivity/communication between any components and to other components, including broadcast/unicast communications, a shared memory management unit 455, and a clock distribution engine 460.

The shared memory management engine 455 controls access to/from multiple, e.g. the "left" and "right", memory blocks of the FPGA, wherein the left and right designation is a legacy designation that is included herein for clarity but supports any memory resources. The memory engine 455 arbitrates among the components requiring external memory resources by intelligently allocating and concurrently managing the requests and the memory banks. Thus a component can use the memory as a swap space for retrieval by other components. The memory banks are independently managed and are also accessible from the operating system for both read and write functions. The memory can therefore also be used by other software applications running on a general purpose processor that work in conjunction with the RCC. The memory engine supports directed or automatic addressing modes, and the eICCbus common to all components allows accessibility. There may be several global clock buffer signals available to the shared memory management engine 455 either directly or via digital clock managers.

In this embodiment there is also a memory bus to TPI bus bridge 457 that allows configuration of the Shared Memory Management module, for example its arbitration scheme, by the GPP.

In one embodiment, the external memory management engine 455 allocates memory for each component and assigns address offsets to each one under the operating system. It also supports direct memory access (DMA) by applications running on the general purpose processors. As a component writes to the external memory, an event monitor captures the write operation along with the pertinent identification data and beginning and ending address pointers of the data. A notification signal is generated and the destination (another component or another application) waiting for data retrieves the data and frees up the memory space. The same mechanism can be used to pass data from a software application to a component. TPI is typically written only once for a given board because it specifically assigns resources of that board.

The clock management engine 460 or global clock distribution engine includes a clock bus necessary for distributing clocks between the components and other engines on the chip in order to allow syncing and timing of processing and communications. The clock engine 460 accepts global clock signals from FPD input pins and distributes them through the chip. A buffered clock input can be processed by clock phase management devices as is known in the art. A local clock is distributed on the local bus to be used by the TPI and other components. Depending upon the clock network and phase management implementations of the FPD, clock multiplication/division, phase changing, and clock multiplexing may be permitted in such a manner that various clocking can be utilized.

The scaleable TPI cross bar switch 470 establishes the point to point full duplex path between two components, and can also be used to establish broadcast messaging by connecting one component to multiple components, whether on-chip or off-chip. The crossbar switch 470 is scalable and communicates in parallel or serial fashion or a combination such as internal component communications in parallel with external communications done in serial, with appropriate parallel/serial converters. The number of I/O ports available to the switch 470 depends upon the gate density of the FPD, and can connect to on-chip ICC engines of the components or external chip pins that communicate with crossbars on other FPD's. In the serial format, the data is clocked at some multiple of the clock speed. Crossbar switches are known in the art, such as those used by the manufacturer Annapolis Microsystems in their board configurations.

The components, the chips and the boards all are recognizable in the system by their addresses and knowledge of their functions is embedded in the software applications exploiting them. This allows the system to communicate with the board as described herein.

Figure 5:
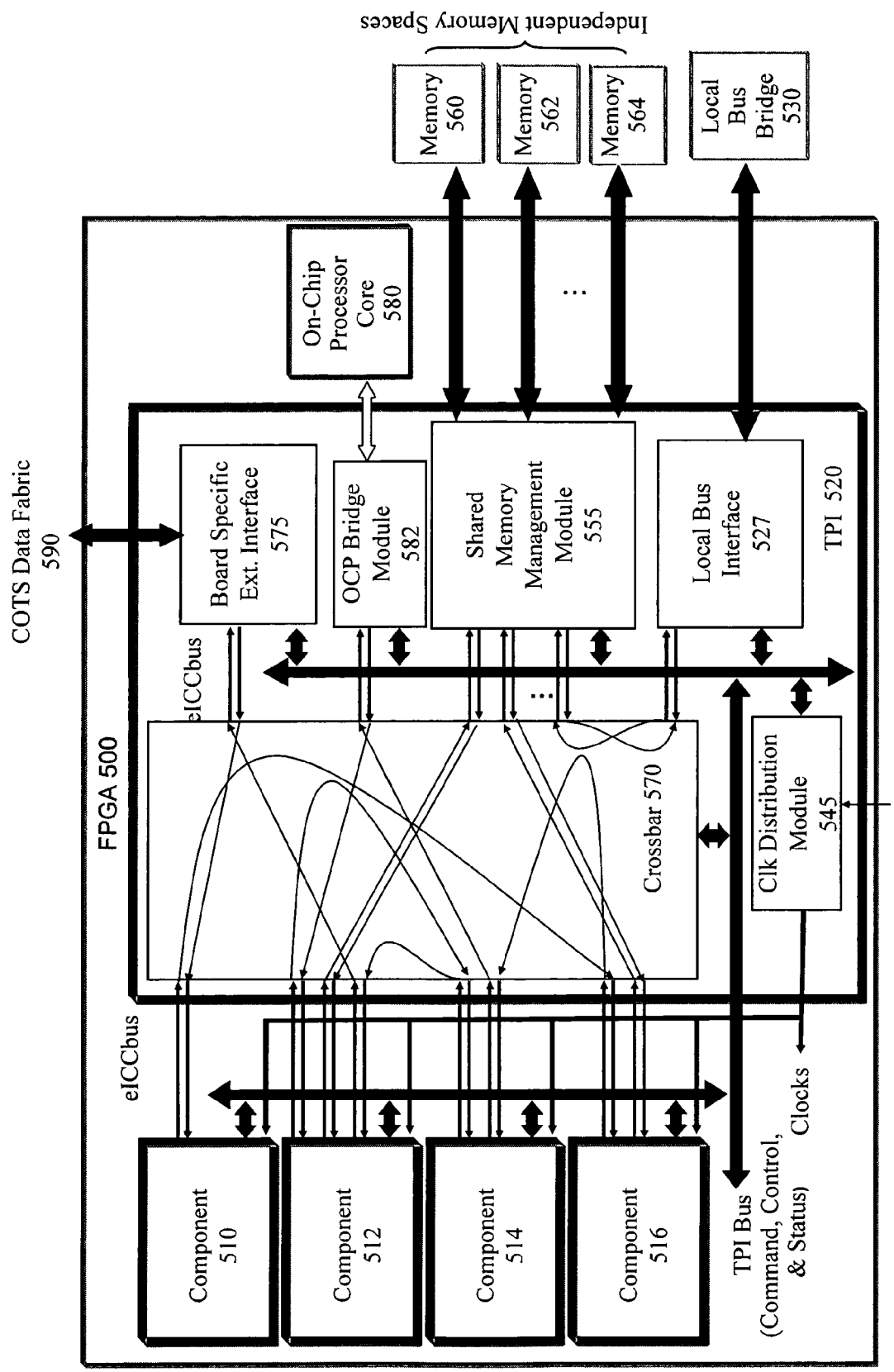
FIG. 5 is a diagrammatic perspective showing the elements and connections for multiple components coupled to the TPI configured in accordance with one embodiment of the present invention.

Referring to FIG. 5, a further depiction of multiple components 510, 512, 514, 516 communicatively coupled to the TPI 520 via the crossbar 570 is depicted according to a further embodiment. As described herein, the architecture of the present invention is built on the concept of making a component with a core application independent of the hardware. Thus, while the TPI 520 is board specific, when a new board is introduced, it is only necessary to alter the TPI 520 as the application has no binding to the physical chip assets and CVI also has no knowledge of the chip resources, as it is only the TPI 520 that has knowledge of the physical resources of the chip. The TPI 520 then allows the rest of the system to utilize the resources of the chip.

As previously described, the TPI 520 provides access to the framework manager and operating system via the local bus interface 527 on the TPI and the external local bus bridge 530 thereby allowing dynamic control of the various chips by the operating system through the TPI. The TPI 520 incorporates the local bus interface 527 which may couple to an external local bus bridge 530 outside the FPD 500. The local bus interface 527 talks to the bridge 530 and generates TPI data bus and control bus information that goes to the TPI 520 and also other chips. The bridge 530 provides the interface to from the system bus to the various FPD's.

The local bus interface 527 is board specific and developed separately for each board and requires certain information, such as chip I/O and resources around each chip, and specific handshake details of the Bridge chip 530 bridging the board to the backplane such as PCI or VME. The TPI off-chip signals are specifically defined for each board with pin mapping for different FPD boards.

Core functions within the components 510, 512, 514, 516 can require memory, internally, externally or both for any particular application. On-chip memory requirements are typically satisfied by the interface between the core and the CVI local memory interface module as described herein, which is used for smaller memory requirements.

The shared memory management module 555 of the TPI 520 can also manage access to various on-chip memory as well as off-chip or external memory 560, 562, 564 which are independent memory spaces. Thus, some algorithms require some small memory that can be provided on-chip as detailed herein. Larger memory requirements can be handled by the off-chip memory via the shared memory management module 555.

Even larger memory requirements can employ the shared memory management module 555 to utilize external independent memory spaces 560, 562, 564. Larger memory requirements would be handled by the external memory banks 560, 562, 564 through the shared memory management module 555 through the crossbar and to the appropriate component 510, 512, 514, 516. The external memory engine 555 bridges the core external memory access requests. The external memory module 555 also supports the directed and automatic addressing modes.

As noted, there can be an on-chip processor (OCP) core 580 that can be any form of general purpose processor residing on the FPD 500. The on-chip processor core 580 communicates with the TPI 520 via the on-chip bridge module 582 that enables access to the processor 580. The OCP Bridge Module at one end adheres to the communication IO protocol of the OCP and at the other to the eICCbus, as well as being connected to the Local bus Interface 527 for control and status. Thus the OCP can be running software applications that source or sink data to the Components 510, 512, 514, and or 516.

In this embodiment, the board specific external interface 575 communicates with a data fabric 590. The data fabric 590 is a board specific COTS serial or parallel data transport mechanism such as FPDP, Serial Rapid 10, Ethernet, or possibly a non-standard data transport, which allows high speed point to point communications between boards external to the system bus, which is usually used for control functions. When multiple same-kind data transports are interconnected, they form a data fabric. For example, the Internet is a data fabric using TCP/IP.

The FPD technology with its ever increasing size, density, clock rate, and on-chip features has made it possible to build sophisticated systems on a chip using COTS and internally developed cores. To facilitate reuse of these cores one embodiment follows a standard connectivity model. The architecture defines the methodology to design reusable cores as Components which can be readily mixed and matched to form a more complex system. One part of this methodology is the use of enhanced Inter-Component Communication Bus. A system built of Components interconnected by the eICCbus via a Crossbar Switch is described herein.

The component developer is responsible for specifying the characteristics of the component connections, i.e. the number of e-ICCbus modules, or the number of ports on each e-ICCbus module. For example, the VHDL process in developing a component is known to those skilled in the art. The process for taking an application and incorporating into the component VHDL library commences in two ways depending upon whether it is a new core or modifying an existing core. For an existing core, the application source code is modified to conform to the I/O standard and parameters of the invention. For a new core, the application source code is written in conformity with the I/O standards of the component system that is laid out in the Component Development Kit (CDK). Thus anyone can draft cores that would be accommodated by the system as long as the I/O standard is followed. The core is combined with the CVI to generate the component that is subsequently stored in the Component Library. The reference to the 'library' is a software conception that designates a file system.

With respect to the VHDL processing, the compilation processes are well known in the art. The first step is to modify the I/O of an existing VHDL core, or design a new VHDL core, to be compatible with the I/O of the present invention. The next step is to provide the CVI interface to produce the component itself, which is added to the component VHDL library, after being verified through simulation and synthesis to comply with the function's requirements. The FPGA board specifications are used in conjunction with the TPI development to provide the outer shell interface, which is stored in the TPI VHDL library.

For a given FPGA board, a TPI integration plan is developed that allows boards from any manufacturers to be used by the components in the component VHDL library. The specifications of the board are used to provide the interface mechanism and the results in a TPI that is compatible with the architecture and framework of this invention, and the TPI interface is stored in a TPI VHDL library.

The bitstream generation process is well known to those skilled in the art. In the case without partial reconfiguration, the selected component from the Component Library is integrated with the corresponding TPI from TPI VHDL library. The bitstream is generated following synthesis and the appropriate FPGA is uploaded.

Bitstream generation without partial reconfiguration is known in the art. Several VHDL components that the user wants to download to the board for a specific application are selected from the component VHDL library. The components are combined with the TPI VHDL for the board on which the components are intended to run in order to generate the bitstream that can be uploaded to the FPGA.

Partial reconfiguration is an approach to programming FPGA's that is more advanced than the full reconfiguration. Bitstreams of different components can be loaded at different times onto the FPGAs.

The end result after development is a VHDL component, a chip with standard interfaces and input/output (I/O) wherein the controller has defined pins that may or may not be used depending upon the application. As there is a parametric interface there is a mechanism wherein the TPI maps to the I/O pins either hard-wired or parametrically through a pin association mapping.

The Local Bus Interface 527 may have other functions, such as performing a boot-up discovery of available components after configuration, and notifying the operating system of events. TPI acts as a bridge between the software API and the TPI, which is the board's main interface to the system bus. The TPI facilitates communications between the component and the API while also notifying the API of event status in the components or external memories among other things. According to one embodiment, the TPI has a boot-up function that maps the location of the components to facilitate the communication data flow.

There are various boards from different manufacturers and components are integrated into the present invention architecture with partial reconfiguration. With respect to Library Creation, a TPI bitstream for a FPD board may be created and stored in the TPI library. One or multiple components may be synthesized in another bitstream and stored in the component library for a processing mission. Using the stored TPI library, the TPI Bitstream for the COTS board is combined with the component bitstream to produce the FPGA upload and configuration. Various missions can be commenced using the component bitstream alone or in combination with another board. The mission can be a related mission or a complimentary mission, however it can also be an entirely unrelated mission.

A comprehensive application manager monitoring the components and resources via a high-level architecture is described in the commonly assigned application entitled "OBSERVATION TOOL FOR SIGNAL PROCESSING COMPONENTS" application Ser. No. 11/063,693 filed on Feb. 23, 2005 which is incorporated by reference for all purposes. This invention describes elements such as applications, tasks, components and framework interconnected to each other and details a framework that integrates the reconfigurable boards into a functional architecture. A further commonly owned patent application entitled "CONFIGURATION ENGINE", application Ser. No. 11/063,693 filed on Nov. 22, 2002 is also incorporated by reference for all purposes.

In one embodiment of the invention described therein, software components are developed and placed in a software library for general purpose processor boards in parallel with the reconfigurable computing components of the present invention. The developer can then pick and choose the software functions from the GPP library or the RCC library depending upon the overall system requirements such as size, weight, power and performance.

Numerous characteristics and advantages have been set forth in the foregoing description, together with details of structures and functions of the present invention, and some of the novel features thereof are pointed out in appended claims. The disclosure, however, is illustrative only, and changes may be made in arrangement and details, within the principle of the invention, to the full extent indicated by the broad general meaning of the terms in which the appended claims are expressed.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A system for a field programmable device (FPD), comprising:
    at least one hardware design language (HDL) application core;
    at least one component virtual interface respectively coupled to said HDL core, said HDL core and said component virtual interface forming a component, wherein said component virtual interface has a plurality of pre-defined interfaces for communicating with said core, and wherein said component is hardware independent of said FPD;
    a target platform interface coupled to said component virtual interface wherein said target platform interface incorporates hardware specific information; and
    a framework manager coupled to said target platform interface and communicating with at least one operating system.

2. The system according to claim 1, wherein a board is comprised of at least one FPD.

3. The system according to claim 1, wherein said FPD comprises at least one component coupled to said target platform interface.

4. The system according to claim 1, further comprising at least one general purpose processor on said FPD.

5. The system according to claim 1, wherein said component comprises a plurality of virtual resources.

6. The system according to claim 1, wherein said target platform interface has a crossbar switch communicatively coupling resources to said component.

7. The system according to claim 1, wherein memory requirements are satisfied by at least one of the group consisting of: local memory and external memory.

8. The system according to claim 1, wherein said FPD comprises an enhanced inter-component communications bus.

9. The system according to claim 8, wherein said enhanced inter-component communications bus provides point-point, broadcast and multi-cast connections.

10. A framework for core applications of a field programmable device (FPD) to be developed independent of hardware elements, comprising:
    at least one component, wherein each said component is comprised of a core application and a respective component virtual interface, wherein said core and said component virtual interface are hardware independent;
    a target platform interface interacting with said component, wherein said target platform interface is hardware specific and binds said component to said FPD and a board; and
    a framework manager coupled to said target platform interface providing an interface to at least one operating system.

11. The framework according to claim 10, wherein said component has a set of modules selected from at least one of the group consisting of: a standard interface module, an enhanced inter-component communications module, and at least one virtual resource.

12. The framework according to claim 10, wherein said target platform interface has a set of modules selected from at least one of the group consisting of: an arbiter, a crossbar switch, a memory management module, a local bus interface, a board specific external interface module, an on-chip processor bridge module, and a clock management module.

13. The framework according to claim 10, further comprising a processing unit embedded on said FPD and coupled to said target platform interface.

14. The framework according to claim 10, further comprising a data fabric coupled to said target platform interface.

15. The framework according to claim 10, further comprising a shared memory management module providing access to at least one of the group consisting of external memory and embedded memory.

* * * * *